(12) United States Patent
Kim

(10) Patent No.: US 10,120,424 B2
(45) Date of Patent: Nov. 6, 2018

(54) CONDUCTIVE STRESS-RELIEF WASHERS IN MICROELECTRONIC ASSEMBLIES

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/410,667

(22) Filed: Jan. 19, 2017

(65) Prior Publication Data

US 2018/0203490 A1  Jul. 19, 2018

(51) Int. Cl.
*G06F 1/20* (2006.01)
*H05K 1/14* (2006.01)
(Continued)

(52) U.S. Cl.
CPC ............ *G06F 1/20* (2013.01); *G06F 1/184* (2013.01); *H01L 23/4006* (2013.01); *H01R 12/7005* (2013.01); *H01R 12/7076* (2013.01); *H01R 12/721* (2013.01); *H01R 12/73* (2013.01); *H05K 1/0204* (2013.01); *H05K 1/092* (2013.01); *H05K 1/111* (2013.01); *H05K 1/117* (2013.01); *H05K 1/144* (2013.01); *H05K 3/368* (2013.01); *H01L 2023/405* (2013.01);
(Continued)

(58) Field of Classification Search
CPC . G06F 1/184; H01L 23/4006; H01R 12/7005; H01R 12/7076; H01R 12/721; H01R 12/73; H05K 1/0204; H05K 1/092; H05K 1/111; H05K 1/117; H05K 1/144; H05K 3/368
See application file for complete search history.

(56) References Cited

U.S. PATENT DOCUMENTS 4,997,787 A  *  3/1991  Eshita ................. H01L 21/7602
                                                148/DIG. 135
5,283,467 A  *  2/1994  Goeschel ............ H01L 23/4006
                                                       165/80.3
(Continued)

FOREIGN PATENT DOCUMENTS

JP          2016018694          2/2016

OTHER PUBLICATIONS

International Search Report and Written Opinion for International Patent Application No. PCT/US18/13899, dated Jun. 22, 2018.

*Primary Examiner* — Binh Tran
*Assistant Examiner* — Douglas Burtner
(74) *Attorney, Agent, or Firm* — Green, Howard & Mughal LLP

(57) ABSTRACT

Microelectronic device assembly including a component attached to substrate by at least a screw. The screw applies compressive force against a pad of a thermally and electrically conductive material having sufficiently low modulus to mitigate stress in addition to providing a thermal and electrical path between the component and the substrate. In some embodiments, the screw affixes a printed circuit board hosting one or more integrated circuit components to a motherboard, or passive heat sink. The pad may be deformed to assuage stress applied through the screw during assembly of the device and/or as the device experiences thermal cycling, for example associated with intermittent operation.

16 Claims, 6 Drawing Sheets

(51) Int. Cl.
  *H05K 1/02* (2006.01)
  *H05K 1/11* (2006.01)
  *H05K 1/09* (2006.01)
  *H01L 23/40* (2006.01)
  *G06F 1/18* (2006.01)
  *H05K 3/36* (2006.01)
  *H01R 12/73* (2011.01)
  *H01R 12/72* (2011.01)
  *H01R 12/70* (2011.01)

(52) U.S. Cl.
  CPC .......... *H01L 2023/4031* (2013.01); *H01L 2023/4087* (2013.01); *H05K 2201/041* (2013.01); *H05K 2201/066* (2013.01); *H05K 2201/10159* (2013.01); *H05K 2201/10325* (2013.01); *H05K 2201/10409* (2013.01)

(56) References Cited

U.S. PATENT DOCUMENTS

| | | | | |
|---|---|---|---|---|
| 5,875,096 | A * | 2/1999 | Gates | H01L 23/10 165/80.3 |
| 6,132,850 | A * | 10/2000 | Hermansen | H05K 3/284 428/206 |
| 6,262,887 | B1 | 7/2001 | Lee | |
| 7,582,951 | B2 * | 9/2009 | Zhao | H01L 23/3128 257/660 |
| 8,596,012 | B2 * | 12/2013 | Franchini | E04F 15/02 52/177 |
| 9,006,770 | B2 * | 4/2015 | Yeh | H01L 33/641 257/99 |
| 9,605,821 | B2 * | 3/2017 | Al-Gaadi | H05K 1/0209 |
| 2003/0067180 | A1 * | 4/2003 | Hosokawa | H01L 21/68707 294/213 |
| 2010/0008046 | A1 * | 1/2010 | Mahoney | H01L 23/3677 361/709 |
| 2010/0059347 | A1 * | 3/2010 | Tang | H01H 13/86 200/302.1 |
| 2010/0255761 | A1 * | 10/2010 | Shibano | C03C 19/00 451/41 |
| 2012/0024575 | A1 * | 2/2012 | Zhang | H01L 23/3677 174/252 |
| 2012/0098117 | A1 * | 4/2012 | Sato | H01L 23/293 257/707 |
| 2013/0062656 | A1 * | 3/2013 | Lee | H01L 25/0753 257/99 |
| 2013/0148322 | A1 | 6/2013 | Fosnes et al. | |
| 2014/0035148 | A1 | 2/2014 | Chuang et al. | |
| 2014/0051269 | A1 | 2/2014 | Chang et al. | |
| 2014/0078677 | A1 * | 3/2014 | Dolci | H01L 23/10 361/719 |
| 2014/0104775 | A1 * | 4/2014 | Clayton | G06F 1/184 361/679.31 |
| 2014/0185118 | A1 * | 7/2014 | Hudson | G02B 26/123 359/204.1 |
| 2014/0334104 | A1 * | 11/2014 | Yang | H05K 5/0047 361/709 |
| 2015/0078408 | A1 * | 3/2015 | Bukkems | H01S 3/1003 372/20 |
| 2015/0098190 | A1 * | 4/2015 | Orsini | H01L 23/40 361/704 |
| 2015/0195956 | A1 * | 7/2015 | Linderman | H05K 1/0203 363/141 |
| 2015/0234437 | A1 * | 8/2015 | Gallina | G06F 1/20 361/679.32 |
| 2017/0069559 | A1 * | 3/2017 | Yamamoto | H01L 23/3675 |
| 2017/0130965 | A1 * | 5/2017 | Eggers | F24C 15/105 |
| 2017/0213479 | A1 * | 7/2017 | Li | G09B 23/183 |

* cited by examiner

CONDUCTIVE STRESS-RELIEF WASHERS IN MICROELECTRONIC ASSEMBLIES

BACKGROUND

Electronic computing devices, such as laptop computers, tablet computers, smart phone handsets, etc. include many different modules assembled together within the device chassis. Each module may include various integrated circuits (ICs) attached to a substrate, such as a printed circuit board (PCB). While IC chips are often permanently affixed to their substrate, for example by solder interconnects, at the module-level assembly often relies on removable fasteners, such as edge connectors and/or screws. The screws are often a metal, such as stainless steel. While metal screws are a centuries-old technique for joining components, their use within modern electronic computing devices is not without issues.

One issue is that a typical metal screw can apply high forces on an IC module, particularly if torque specifications are not followed during assembly. Over-torqueing a screw will usually damage the IC module well before the threads are stripped or the screw otherwise damaged. For example, when an assembly screw is over-driven a module PCB can be crushed between the screw head and mount. Over-tightening can also cause the PCB to deflect, stressing nearby IC solder joints toward the point of failure.

Another issue is that a typical metal screw, even if tightened to within a torque spec, does not have a low enough modulus to yield under stress associated with thermal cycling of the assembly. For example, screw elongation will typically not occur before the stress is concentrated and relieved by mechanical failures at the microscale, often at the interface of an IC and a PCB (e.g., solder joints).

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
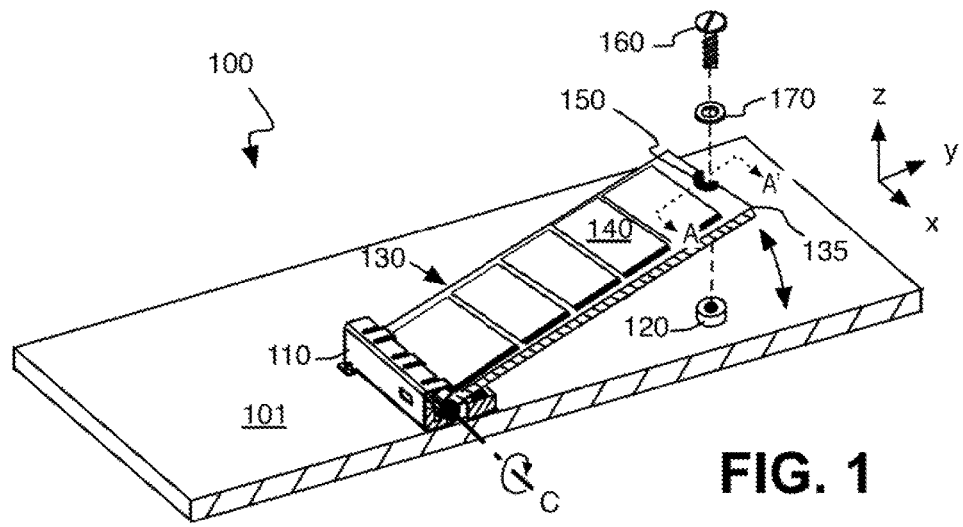
FIG. 1 is a partially exploded isometric-sectional drawing illustrating an assembly including a component affixed to an assembly substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are conductive stress-relief pads suitable for use in microelectronic assemblies employing one or more screws or other fasteners that apply a compressive force between components of the assembly. Exemplary pads and assemblies including such pads are further described herein. Exemplary techniques for fabricating such pads and assembling microelectronic devices with such pads are also described herein. The conductive stress-relief pads may distribute stress or load created from a screw or other fastener while the pad may further function as a thermal interface material (TIM) and/or electrical interface material. The pad may be of a material of suitably low thermal and electrical resistivity and have a modulus lower than other components to which the fastener applies a compressive load. As such, the pad may deform to an extent that reduces the load applied to other components of the assembly. In some embodiments, the pad comprises an elastomer that elastically deforms under compressive load applied through the screw or other fastener during an assembly process and/or applied as a result of thermal cycling, which may occur during intermittent operation of a device that includes the assembly.

FIG. 1 is a partially exploded isometric-sectional view illustrating an assembly 100 including a module 130 affixed to an assembly substrate 101, in accordance with some embodiments. Assembly substrate 101 may be any substrate suitable as a support to module 130. Assembly substrate 101 may be more massive and/or dimensionally larger than module 130, but need not be. In some embodiments, assembly substrate 101 is a motherboard hosting one or more integrated circuits (ICs) and/or discrete electronic components. In some such embodiments, assembly substrate 101 is a printed circuit board (PCB), for example including one or more interconnect trace levels laminated with one or more glass-reinforced epoxy sheets, such as, but not limited to FR-4. For some such embodiments, the one or more ICs include a microprocessor, such as but not limited to, a central processing unit, a graphics processing unit, a heterogeneous processor, or the like. Assembly substrate 101 may be associated with an electrical ground plane that provides a reference potential to one or more of the ICs or discrete components affixed to substrate 101.

As further illustrated in FIG. 1, a stopper, stand-off, or mount 120 is located over a first side of substrate 101. Mount 120 is spaced apart from a socket 110 also located over the first side of substrate 101. Socket 110 may further include a plurality of electrical contacts (not depicted). In some embodiments, one or more contact row extends along a transverse width of socket 110. A contact row includes at least one electrical contact, which may further comprise a conductive (e.g., metal) member cantilevered from an anchor point to provide a spring force to a contact surface on a first (leading) edge of module 130.

Module 130 includes a module substrate 135 to which one or more ICs 140, and/or discrete electronic components, are electrically coupled. ICs 140 may be affixed to substrate 135 through a socket mounted to substrate 135, or through solder features, for example. Substrate 135 may include an edge connector configured to mate with socket 110. In some embodiments, substrate 135 is a PCB, for example including one or more interconnect trace levels laminated with one or more glass-reinforced epoxy sheets, such as, but not limited to FR-4. In some embodiments module 130 complies with one or more features and/or attributes associated with the M.2 specification (e.g., PCI Express M.2 Specification Rev. 1.x PCI-SIG®, with Rev. 1.1 released on Dec. 15, 2016). One or more of the trace levels may terminate at edge contacts suitable for electrically interfacing the contacts on socket 110.

For some embodiments, the one or more ICs 140 include a non-volatile memory IC, such as but not limited to, flash (e.g., NAND) memory ICs. In some such embodiments, module 130 is a solid state drive (SSD) module including a plurality of non-volatile memory ICs mounted to module substrate 135. SSD M.2 modules may be substantially rectangular, as illustrated in FIG. 1 (e.g., having dimensions around 22 mm×80 mm). Signals, and/or power, and/or ground paths between substrate 135 and substrate 101 are provided by connector 110 when a leading edge of substrate 135 is inserted into connector 110. During assembly, substrate 135 may be rotated along a transverse axis C against a fulcrum of socket 110. During assembly, substrate 135 may operate as a class 2 lever, for example, as it rotates against socket 110 and compresses the socket contacts. Strain in socket contacts may be balanced with a force maintained by a fastener affixing a trailing edge of substrate 135 to mount 120. Any fastener known to be suitable for microelectronic assembly may be employed to affixed substrate 135 to mount 120. Exemplary fasteners include, but are not limited to, one or more screws, spring clips, adhesive bonds, solder joints, or rivets. In the embodiments illustrated by FIG. 1, the fastener comprises a single screw 160, which has a screw head that is to overlap a surface of substrate 135 and threads to mate with substrate 101 (e.g., to thread into mount 120 or any other fitting attached thereto). Screw 160 may be of an electrically conductive material, such as a metal (e.g., stainless steel). Screw 160 may be of any suitable size, and may adhere to a standard dimensioning system (e.g., M2-M4) specifying head diameter (e.g., 1.5-3 mm), threads per until length, shaft length, head thickness, etc. In some embodiments, substrate 135 includes a through hole, or indent (detent) that at least partially surrounds a tensile-strained member of the fastener (e.g., shaft of screw 160). In the embodiments illustrated by FIG. 1, screw 160 is to pass through a semicircular (e.g., half-moon) indent in the trailing edge of substrate 135. Screw 160 lands on and/or passes through mount 120. While only one fastener detent is typical in an SSD module of the exemplary size, two or more screws are also possible.

In some embodiments, an assembly includes a stress-relief pad that is to deform under stress transmitted to a component by a fastener employed in the assembly. In FIG. 1, for example, assembly 100 further includes a stress-relief pad 170. Stress-relief pad 170 is to relieve at least some stress transmitted to substrate 135 through one or more of socket 110 and the trailing edge fastener (e.g., screw 160). In some embodiments illustrated by FIG. 1, stress-relief pad 170 is in the form of an annular "washer" with an inner diameter (ID) through which a shaft of screw 160 passes through. The washer ID is smaller than an outer diameter (OD) of the screw head such that compressive force applied to substrate 135 by tensile stress in screw 160 is transmitted through pad 170. In some embodiments, the stress-relief is in the form of elastic deformation reducing stress transmitted to a component by a fastener employed in the assembly. Elastic pad deformation is advantageous for accommodating intermittent stress, for example arising between components of an assembly having different thermal expansion coefficients as the various components experience thermal cycling, for example during operation of a device including the assembly.

Figure 2:
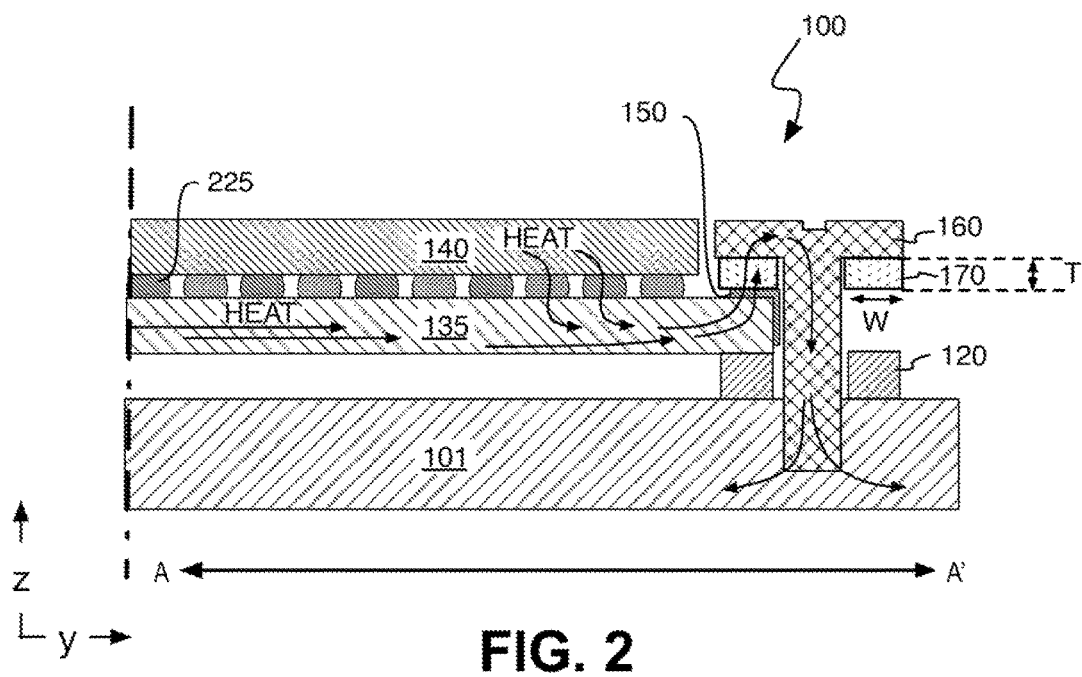
FIG. 2 is a cross-sectional view of an IC module assembly, in accordance with some embodiments.

FIG. 2 is a cross-sectional view of assembly 100, in accordance with some embodiments. As shown, ICs 140 are electrically connected to module substrate 135 by a plurality of solder features 225 (e.g., solder ball grid array and/or land grid array, etc.). Heat flow from ICs 140 conducts through solder features 225 and/or a thermal interface material into module substrate 135. Heat flow continues through pad 170, into screw 160, where it is dissipated by substrate 101. As further shown in FIG. 2, pad 170 has a nominal thickness T. In some embodiments T is no more than 3 mm (e.g., between 0.2 mm and 1 mm). In some exemplary embodiments, in response to a threshold torque applied to screw 160 during an assembly process, a portion of pad 170 located between the screw head and conductive feature 150 is deformed to a compressed thickness that is less than nominal thickness T. Where the screw head extends beyond the edge of substrate 135, the nominal thickness T may be maintained even while screw 160 is under tensile stress. In some embodiments, the deformation accounting for the different in pad thicknesses between compressed and uncompressed regions of the pad is elastic deformation. As further shown in FIG. 2, pad 170 has a nominal annular width W. In some embodiments, annular width W, when added to the ID of the annular washer is no more than the diameter of the head of screw 160. In other words, the nominal OD of pad 170 does not exceed the diameter of the head of screw 160. Hence, pad 170 need not distribute force applied by screw 160 over a greater area than that of the screw head, and may be no larger than the screw head to maintain a desired lateral spacing from ICs 140. In some exemplary embodiments, in response to a threshold torque applied to screw 160 during an assembly process, a portion of pad 170 located between the head screw 160 and substrate 130 is deformed to a compressed annular width that is larger than nominal annular width W. Where the screw head extends beyond the edge of substrate 135, the nominal annular width W may be maintained even while screw 160 is under tensile stress.

In some embodiments, a stress-relief pad may advantageously have a bulk and/or elastic modulus below that of other components in the assembly. In some further embodiments, a stress-relief pad may advantageously have a shear modulus below that of other components in the assembly. Stress-relief pad may, for example, be of a material advantageously having a hardness no more than 50 Shore C. In some further embodiments, stress-relief pad is of a material having a hardness no more than 50 Shore A (i.e., ~20 Shore C).

In some embodiments, a stress-relief pad is electrically conductive. Electrical conductivity of the pad may vary, but in exemplary embodiments is sufficient to maintain components mounted together through the pad at a same reference voltage potential (e.g., ground). A stress-relief pad may, for example, be of a material advantageously having a bulk resistive no more than 10,000 Ω-cm. In some further embodiments, stress-relief pad is of a material having a bulk resistive no more than 1000 Ω-cm. In still other embodiments, stress-relief pad is of a material having a bulk resistive no more than 500 Ω-cm. In some embodiments, an electrical path of least resistance between two substrates of an assembly includes the pad. For example, the pad may provide an electrical path of least resistance between a conductive portion of a first substrate and a fastener member. The fastener member may further provide an electrical path of least resistance between the pad and another substrate of the assembly. In embodiments illustrated by FIG. 1, pad 170 is to be in electrical contact with a conductive portion of substrate 135. Substrate 135 includes a conductive trace, pad or feature 150 along a perimeter of semicircular indent in the trailing edge of substrate 135. Conductive feature 150 may be electrically coupled to a ground plane associated with module 130. Pad 170 is further to contact with screw 160 (e.g., the head of the screw), thereby tying the ground plane of module 130 to a ground plane of substrate 101.

In some embodiments, a stress-relief pad is thermally conductive. Thermal conductivity of the pad may vary, but in exemplary embodiments is sufficient to provide a significant thermal conduction pathway between two substrates joined through the pad. For example, in the embodiments illustrated by FIG. 1, there are only two physical contact points between substrate 135 and substrate 101; one being socket 110 and the other being mount 120. During operation, heat generated by components 140 may be conducted to substrate 101 through socket 110 and mount 120. Thermal conductivity through mount 120 may be improved where thermal conduction through the trailing edge fastener (e.g., screw 160) is improved. Hence, the more thermally conductive pad 170, the better the thermal conduction between substrates 130 and 135. FIG. 2 further illustrates heat flow through pad 170. Notably, the inventor has found (e.g., through thermal modeling) that the portion of heat conducted away from substrate 135 through screw 160 can be significant, particularly where pad 170 is of a material having high thermal conductivity (e.g., at least 1 W/m-K). In some embodiments that are even more advantageous, pad 170 is of a material having even higher thermal conductivity (e.g., at least 30 W/m-K).

Various materials may be employed as a stress-relief pad having one, or more, or all, of the features or attributes described herein. A stress-relief pad may be homogeneous, heterogeneous, or a laminate, any of which may be machined into a disc spring, wave, split lock, or crush washer configuration, if desired. In some embodiments, a stress-relief pad is a soft metal (e.g., indium). In some advantageous embodiments however, a stress-relief pad comprises a polymer. In some such embodiments the polymer is an elastomer. In some embodiments, the polymer is a silicone (polysiloxane) compound (e.g., silicon resin, silicone rubber, etc.). In some embodiments, a stress-relief pad includes a (matrix) material loaded with a conductive filler. Any matrix material may be loaded with any conductive filler known in the art to fabricate a pad material with one, or more, or all, of the attributes and/or properties described herein. Conductive fillers may be solid conductive particles or particles coated with a conductive coating, for example. Exemplary conductive particles include micro-to-nanometer dimensioned particles of a carbon (e.g., graphite).

Other exemplary conductive particles include micro-to-nanometer dimensioned particles of a metal, such as, but not limited to, Ag, Cu, or Ni in pure or alloy form. Conductive filler particles may also comprise micro-to-nanometer dimensioned particles of a first material coated with a conductive material, such as, but not limited to pure metals or alloy metals. While many materials (e.g., silicone) loaded with a variety of fillers (e.g., Ag or graphite particles) are known, some exemplary materials are commercially available from SinoGuide, Inc. under the trade names of AL20 and AL50. Such materials are available as pre-preg sheets, which may then be die or laser cut, for example into any of the various form factors described herein, to suit the geometry of the assembly components and/or fasteners employed.

Figure 3A:
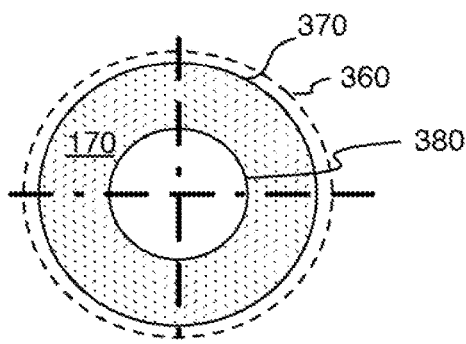
FIGS. 3A, 3B, and 3C are plan views of conductive stress-relief washers, in accordance with some embodiments.
Figure 3B:
Figure 3B:
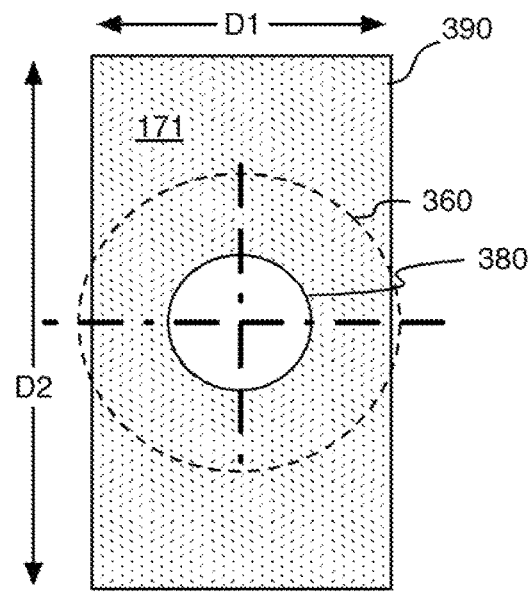
Figure 3C:
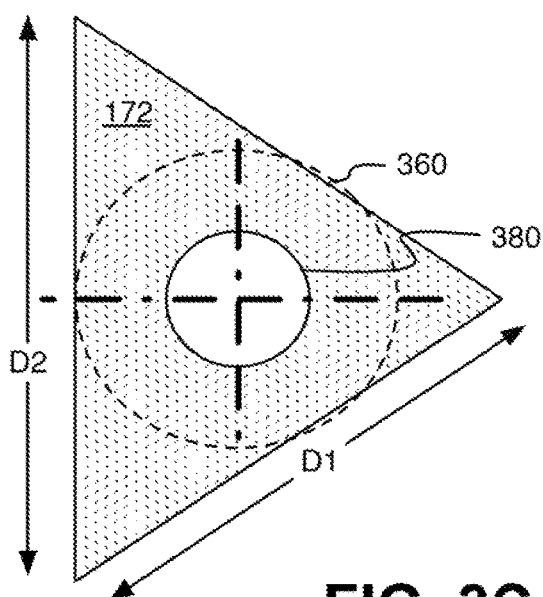

FIGS. 3A, 3B, and 3C are plan views of conductive stress-relief pads, in accordance with some embodiments. FIG. 3A further illustrates conductive stress-relief pad 170 having the annular washer form factor introduced in the context of assembly 100. In some such embodiments, a material (e.g., silicon) loaded with conductive filler (e.g., Ag or graphite particles) is cut to have an ID no more than 2 mm and an outer diameter (OD) no more than 3 mm (e.g., 2-2.6 mm). As further illustrated, pad 170 is dimensioned to have an OD less than the diameter of a screw head 360 denoted in dashed line. FIG. 3B further illustrates conductive stress-relief pad 171 having a rectangular (square) form factor, which may advantageously increase an area of the pad for a given first dimension D1 that is no more than the diameter of screw head 360. Dimension D2 may vary, for example up to a full width of a substrate. Pad 171 may have any (or all) of the features, attributes, or properties described elsewhere herein, for example in the context of pad 170. FIG. 3C further illustrates conductive stress-relief pad 172 having a triangular form factor, which may also advantageously increase an area of the pad beyond that associated with screw head 360 while potentially avoiding contact with components in proximity of the screw. For such embodiments, dimension D1 and/or D2 may vary, for example up to a full width of a substrate. Pad 172 may have any (or all) of the features, attributes, or properties described elsewhere herein, for example in the context of pad 170.

Figure 4:
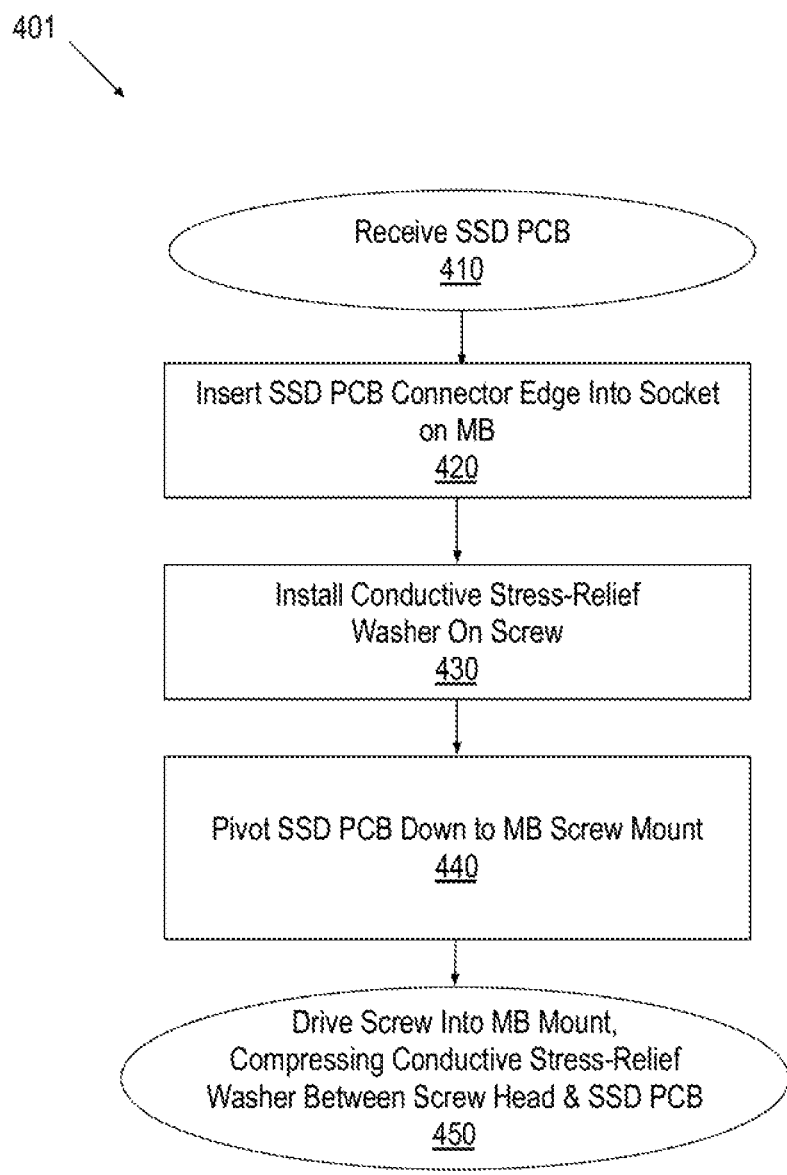
FIG. 4 is a flow diagram illustrating methods for assembling an IC module assembly, in accordance with some embodiments.

FIG. 4 is a flow diagram illustrating methods 401 for assembling a microelectronics assembly, in accordance with some embodiments. Methods 401 may be practiced to assemble microelectronics assembly 100, for example. Methods 401 begin at operation 410 where a module substrate, such as a PCB, is received. The PCB may be any module board, for example a SSD module. Methods 420 continue at operation 420 where the module substrate is inserted in a socket on another PCB. In some exemplary embodiments, an edge connector of the module is inserted into an edge connector socket on the motherboard. At operation 430 a conductive stress-relief washer is installed on a shaft of a screw. Alternatively, the stress-relief washer may be affixed to the module substrate, for example on a trailing edge of an SSD module board, with a thermal paste. At operation 440, the module substrate is pivoted about a fulcrum of the socket to bring a trailing edge of the module substrate down toward the surface of the motherboard, for example to contact a mount on the motherboard. The torque applied to the socket may compress one or more contacts against the edge connector. The torque applied to the socket may be maintained at operation 450 by driving a screw into and/or through the motherboard mount. Torque applied to the screw may apply a compressive stress on the conductive stress-relief washer, thereby mitigating assembly stress transmitted to the module substrate. The stress-relief washer may be deformed (e.g., compressed) in response to the stress. In the compressed state, the stress-relief washer may conduct heat and/or electricity between the module substrate and the motherboard through the screw. Methods 401 are then substantially complete. Any conventional may be performed thereafter to arrive at a fully-assembled device.

Figure 5A:
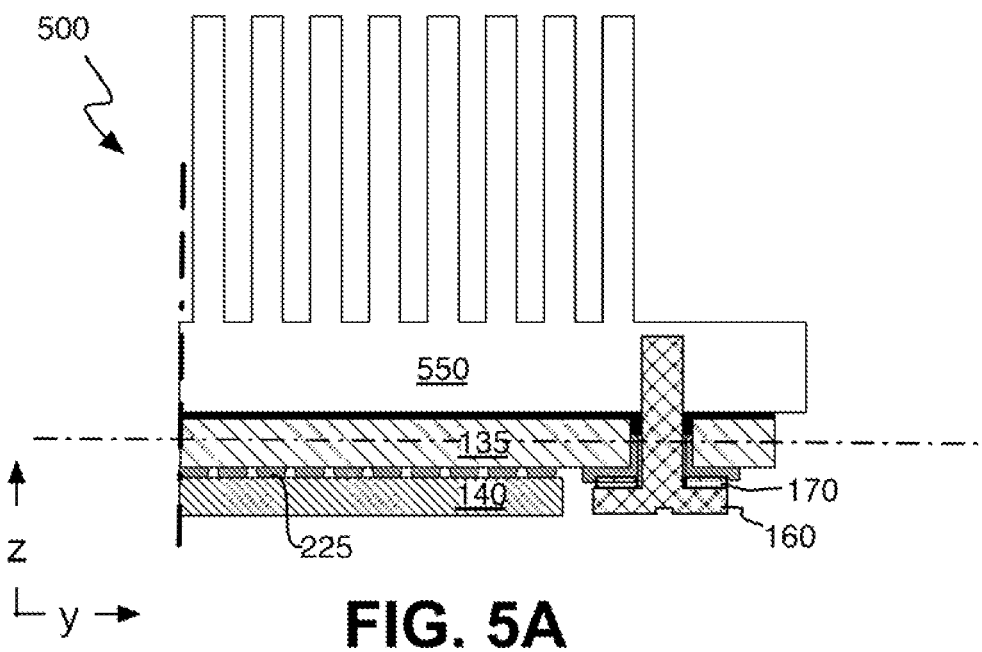
FIG. 5A is a cross-sectional view of an IC module assembly at a steady state temperature, in accordance with some embodiments.

Notably, stress-relief pads having one, or more, or all, of the attributes or properties described herein may be employed within many other microelectronic assembly contexts. For example, while various attributes or properties of a stress-relief pad were illustrated in detail for assembly of an SSD module, the same properties may be useful in an assembly of components that can experience stress associated with thermal cycling. The stress-relief pad may then mitigate stress transmitted between components as the various components expand and contract differently according to a temperature gradient and/or different coefficients of thermal expansion (CTE) within the assembly. In some embodiments, stress between a heat sink of a first material and a module comprising one or more other material is mitigated by concentrating strain within a stress-relief pad. FIG. 5A is a cross-sectional view of an IC module assembly 500 at a first temperature, in accordance with some embodiments. As shown, IC 140 is affixed to substrate 135 (e.g., a PCB) by an array of solder features 225. Substrate 135 is affixed to a heat sink 550 by screw 160. Heat sink 550 may be a passive sink, for example comprising a cast or machined metal block. Torque applied to screw 160 during an assembly process compresses stress-relief washer 170 between a head of screw 160 and a surface of substrate 135 (e.g., a conductive feature surface). At some nominal steady-state temperature, stress within assembly 500 may be at a first level associated only with the assembly process.

Figure 5B:
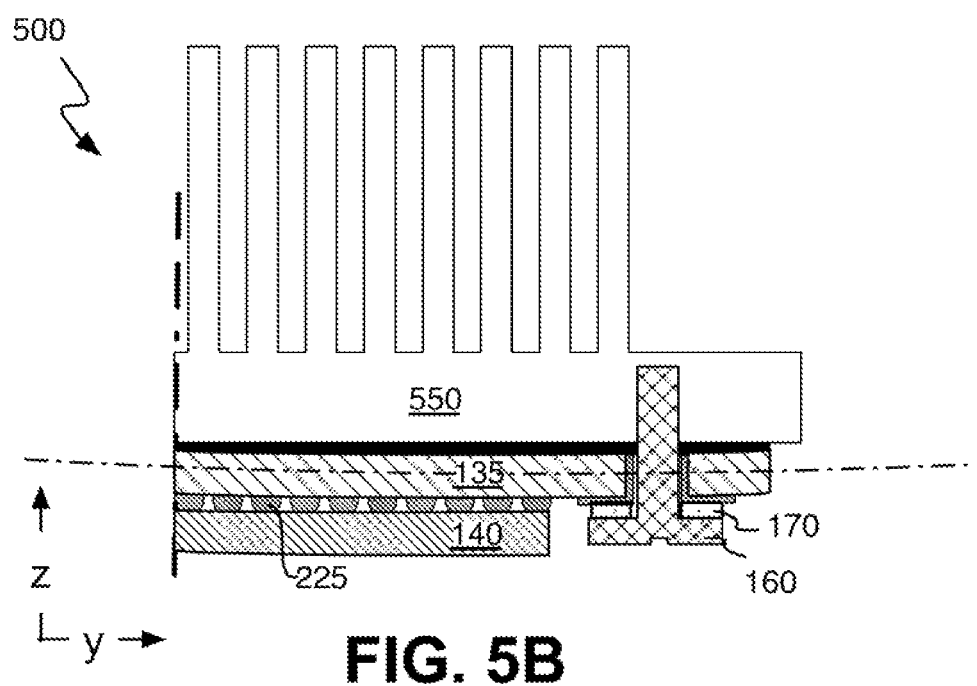
FIG. 5B is a cross-sectional view of an IC module assembly with component warp resulting from a temperature gradient, in accordance with some embodiments.

During operation, assembly 500 may experience variable and/or intermittent periods during which various components consume electrical power, some of which is converted into heat. With one or more components at a second temperature, stress within assembly 500 may be at a second level associated with non-uniform heating and/or material expansion. FIG. 5B is a cross-sectional view of assembly 500 with IC 140 at a second temperature, in accordance with some embodiments. As shown, differences in temperature and/or CTE between heat sink 500 (e.g., having a CTE associated with a metal) and IC 140 induces warp within substrate 135 and/or IC 140. For example, IC 140 may expand by 10-20 ppm/° C. in response to having a higher (e.g., 20-40° C.) temperature than heat sink 550. Stress-relief pad 170 deforms in response to the warp, for example either expanding to maintain thermal and/or electrical contact between substrate 135 and screw 160, or compressing to allow substrate 135 to warp along with IC 140 and thereby reduce stress within solder features 225. The use of stress-relief pad 170 may therefore reduce mechanical failure rates within assemblies that experience stress associated CTE mismatch.

Figure 6:
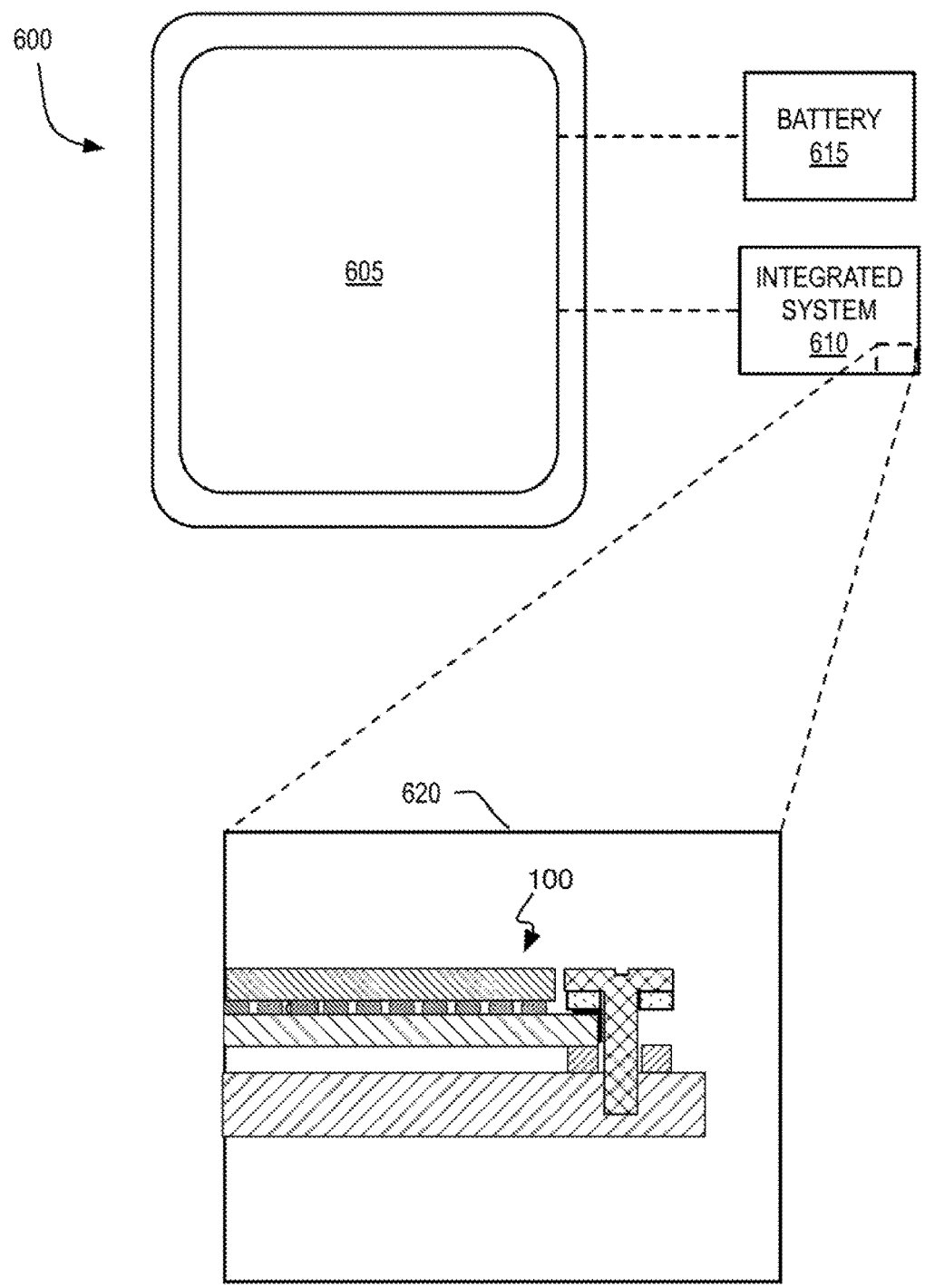
FIG. 6 illustrates a mobile computing platform employing an IC module assembly, in accordance with embodiments.

FIG. 6 illustrates a mobile computing device 600 employing an assembly including a screw passing through a stress-relief washer that is thermally and electrically conductive, for example as described elsewhere herein. Device 600 may be a portable or infrastructure device configured for at least one of electronic data display, electronic data processing, wireless electronic data transmission, or the like. Although illustrated as a tablet, computing device 600 may be any of a tablet, a smartphone, a laptop computer, a watch, an augmented reality device, a virtual reality device, a headset, a desktop computer, a television, a set-top box, a commercial data serving machine, etc. Device 600 may include an integrated display 605, such as active matrix display.

Also as further shown, mobile computing platform 600 includes a platform-level integrated system 610 and a battery 615. Integrated system 610 may include may include memory circuitry (e.g., random access memory, storage, etc.), processor circuitry (e.g., a microprocessor, a multi-core microprocessor, graphics processor, etc.), and communications circuitry (e.g., a wireless transceiver, a radio frequency integrated circuit, a wideband RF transmitter and/or receiver, etc.). The components of integrated system 610 may be communicatively coupled to one another for the transfer of data within integrated system. Integrated system 610, as further shown in expanded view 620 may include assembly 100. As such, one or more fasteners may physically couple the components of integrated system 610 together. The fasteners may further electrically couple and/or thermally couple the components of integrated system 610 together. In some embodiments, one or more screws compress a pad (e.g., a washer) that is thermally and electrically conductive, for example as described elsewhere herein, with the pad thereby providing one or more of electrical conduction, thermal conduction, and stress-relief between the components.

Functionally, memory circuitry may provide memory and storage for integrated system 610 including image and/or video data for output by display 605, processor circuitry may provide high level control for mobile computing platform 600 as well as operations corresponding to generating image and/or video data for output by display 605. Communications circuitry may transmit and/or receive data including image and/or video data for output to display 605. For example, communications circuitry may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Battery 615 may be coupled to integrated system 610 and/or display 605 and supply power during operation of platform 600.

Figure 7:
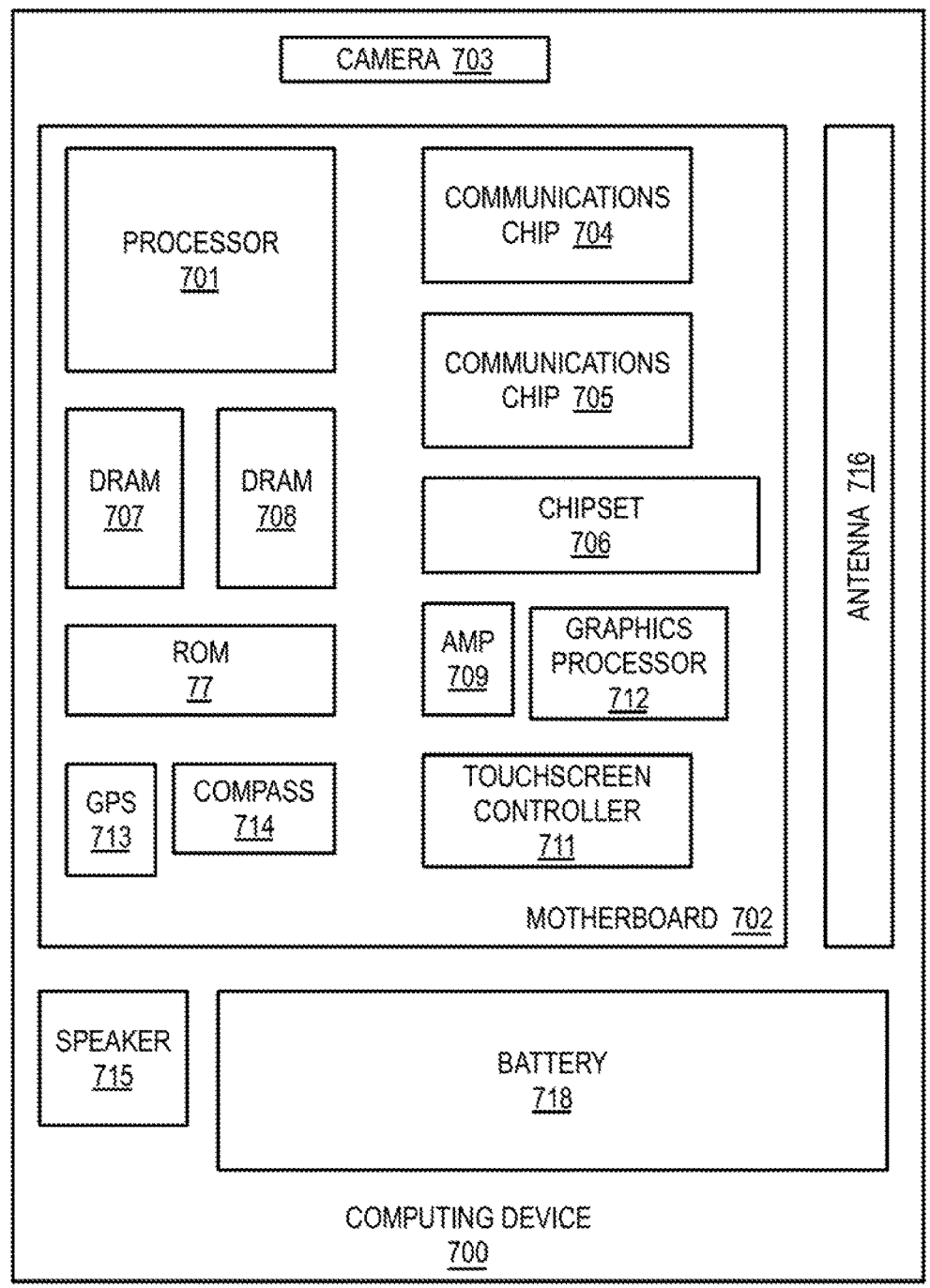
FIG. 7 is a functional block diagram of an electronic computing device, in accordance with some embodiments.

FIG. 7 is a functional block diagram of a computing device 700, arranged in accordance with at least some implementations of the present disclosure. Computing device 700 or portions thereof may be implemented within computing platform 600, for example. Device 700 includes a motherboard 702 hosting a number of components, such as but not limited to a processor 701 (e.g., an applications processor, a microprocessor, etc.) and one or more communications chips 704, 705. One or more of the components illustrated in FIG. 7 may be affixed to a daughter board that is in-turn assembled to motherboard 702 with a screw that passes through a stress-relief pad (e.g., washer) that is also thermally and/or electrically conductive, for example as described elsewhere herein. Processor 701 may be physically and/or electrically coupled to motherboard 702. In some examples, processor 701 includes an integrated circuit die packaged within the processor 701. In general, the term "processor" may refer to any device or portion of a device that processes electronic data from registers and/or memory to transform that electronic data into other electronic data that may be stored in registers and/or memory.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics processor 712, flash memory, global positioning system (GPS) device 713, compass 714, a chipset 706, an antenna 716, a power amplifier 709, a touchscreen controller 711, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. Touchscreen controller 711 may, for example, interface with a backplane of display assembly 801 (FIG. 8).

Communication chips 704, 705 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation. The term does not imply that the associated devices do not contain any wires, although in some embodiments they might not. Communication chips 704, 705 may implement any of a number of wireless standards or protocols, including but not limited to those described elsewhere herein. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. One or both of communication chips 704, 705 may provide a wireless transceiver for computing device 700.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, a microelectronic device assembly, comprises a first substrate, and a second substrate including one or more integrated circuit (IC) components electrically coupled to the second substrate. A screw affixes the second substrate to the first substrate. An electrically and thermally conductive pad between a head of the screw and a metal feature on the first or second substrate, wherein the pad is deformed by a force maintained by the screw.

In one or more second examples, for any of the first examples the pad comprises a material having a hardness below 50 Shore C.

In one or more third examples, for any of the first or second examples the pad comprises a material having a thermal conductivity of at least 1 W/m-K.

In one or more fourth examples, for any of the first, second, or third examples the pad comprises a material having a volume resistivity no more than $1.0 \times 10^4$ Ω-cm.

In one or more fifth examples, for any of the first, second, third, or fourth examples the pad has a thickness no greater than 1 mm and an outer diameter (OD) no more than 2 mm.

In one or more sixth examples, for any of the first, second, third, fourth, fifth, or sixth examples the pad OD is no larger than an OD of the screw head.

In one or more seventh examples, for any of the first, second, third, fourth, fifth, sixth, or seventh examples the pad comprises a material having a hardness no more than 50 Shore A, a thermal conductivity of at least 30 W/m-K, and a volume resistivity no more than 500 Ω-cm.

In one or more eighth examples, for any of the first, second, third, fourth, fifth, sixth, or seventh examples the pad comprises a material loaded with a conductive filler.

In one or more ninth examples, for any of the first, second, third, fourth, fifth, sixth, seventh, or eighth examples the material comprises silicone and the filler comprises at least one of carbon particles, metal particles, or metal-coated particles.

In one or more tenth examples, for any of the first, second, third, fourth, fifth, sixth, seventh, eighth, or ninth examples the first substrate comprises a first printed circuit board (PCB) including an edge connector socket and a screw mount, the screw mated to the screw mount, and the screw mount electrically coupled to a ground plane of the first PCB. The second substrate comprises a second PCB having edge connector traces at a first edge of the second PCB mated with the edge connector socket, one or more sockets or lands coupling the one or more IC components to the edge connector traces, and a semicircular indent or through hole at a second edge of the second PCB, the screw extending through the indent or hole. The metal feature comprises an electrically conductive trace adjacent to an edge of the indent or through hole and electrically coupled to a ground plane of the second PCB. The pad comprises an annular washer surrounding the screw that is compressed between the screw head and the electrically conductive trace.

In one or more eleventh examples, for any of the first, second, third, fourth, fifth, sixth, seventh, eighth, ninth, or tenth examples the one or more IC components comprise a plurality of non-volatile memory ICs, and the edge connector and the screw mount are only physical connections between the first and second substrates.

In one or more twelfth examples, for any of the first, second, third, fourth, fifth, sixth, seventh, eighth, ninth, tenth, or eleventh examples the first substrate is a metal heat sink and the second substrate is a printed circuit board (PCB).

In one or more thirteenth examples, an electronic computing device comprises a mother board including a screw mount electrically coupled to a ground plane of the motherboard, and an edge connector socket. The device a solid state drive (SSD) including a plurality of non-volatile memory ICs mounted to a printed circuit board (PCB), the PCB having edge connector traces at a first edge of the PCB mated with the edge connector socket, the traces coupled to the memory ICs, a semicircular indent or through hole at a second edge of the PCB, and an electrically conductive trace adjacent to an edge of the indent or through hole, and electrically coupled to a ground plane of the PCB. The device comprises a screw affixing the PCB to the motherboard, the screw passing through the indent or hole. The device comprises an annular washer surrounding the screw and located between a head of the screw and the electrically conductive trace. The ground planes of the PCB and motherboard are electrically coupled through at least the washer. The PCB is thermally coupled to the motherboard through at least the washer, and the washer is elastically deformed between a head of the screw and the PCB.

In one or more fourteenth examples, for any of the thirteenth examples the washer comprises a material loaded with a conductive filler.

In one or more fifteenth examples, for any of the thirteenth or fourteenth examples the loaded material has a hardness below 50 Shore C, a thermal conductivity of at least 1 W/m-K, and a volume resistivity no more than $1.0 \times 10^4$ Ω-cm.

In one or more sixteenth examples, for any of the thirteenth, fourteenth, or fifteenth examples the material comprises silicone, the filler comprises at least one of carbon particles, metal particles, or metal-coated particles. The material has a hardness no more than 50 Shore A, a thermal conductivity of at least 30 W/m-K, and a volume resistivity no more than 500 Ω-cm.

In one or more seventeenth examples, for any of the thirteenth, fourteenth, fifteenth or sixteenth examples the device further comprises a microprocessor electrically coupled to the motherboard, and a chassis to which the motherboard is mounted.

In one or more eighteenth examples, a method of fabricating a microelectronic device assembly comprises receiving a printed circuit board (PCB), inserting an edge connector of the PCB into a socket on a motherboard, and driving a screw into the motherboard until a pad located between a head of the screw and the PCB is elastically deformed by force applied to the screw, wherein the pad comprises an electrically and thermally conductive material.

In one or more nineteenth examples, for any of the eighteenth examples driving the screw further comprises positioning the screw within a semicircular indent or through hole in the PCB and compressing the pad against an electrically conductive trace adjacent to an edge of the indent or through hole and electrically coupled to a ground plane of the PCB.

In one or more twentieth examples, the pad comprises a die-cut elastomer loaded with at least one of carbon particles, metal particles, or metal-coated particles. The loaded elastomer has a hardness no more than 50 Shore A, a thermal conductivity of at least 30 W/m-K, and a volume resistivity no more than 500 Ω-cm.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A microelectronic device assembly, comprising:
   a first substrate;
   a second substrate including one or more integrated circuit (IC) components electrically coupled to the second substrate;
   a screw affixing the second substrate to the first substrate; and
   an electrically and thermally conductive pad between a head of the screw and a metal feature on the first or second substrate, wherein the pad is deformed by a force maintained by the screw,
wherein the pad comprises a material having a hardness below 50 Shore C;
wherein the pad comprises a material having a thermal conductivity of at least 1 W/m-K; and
wherein the pad comprises a material having a volume resistivity no more than $1.0 \times 10^4$ Ω-cm.

2. The assembly of claim 1, wherein the pad comprises a material having a hardness below 50 Shore A.

3. The assembly of claim 1, wherein the pad comprises a material having a thermal conductivity of at least 30 W/m-K.

4. The assembly of claim 1, wherein the pad comprises a material having a volume resistivity no more than 500 Ω-cm.

5. The assembly of claim 1, wherein the pad has a thickness no greater than 1 mm and an outer diameter (OD) no more than 2 mm.

6. The assembly of claim 5, wherein the pad OD is no larger than an OD of the screw head.

7. The assembly of claim 1, wherein the pad comprises a material having:
a hardness no more than 50 Shore A;
a thermal conductivity of at least 30 W/m-K; and
a volume resistivity no more than 500 Ω-cm.

8. The assembly of claim 1, wherein the pad comprises a material loaded with a conductive filler.

9. The assembly of claim 1, wherein the material comprises silicone and the filler comprises at least one of carbon particles, metal particles, or metal-coated particles.

10. The assembly of claim 1, wherein:
the first substrate comprises a first printed circuit board (PCB) including an edge connector socket and a screw mount, the screw mated to the screw mount, and the screw mount electrically coupled to a ground plane of the first PCB;
the second substrate comprises a second PCB having:
edge connector traces at a first edge of the second PCB mated with the edge connector socket;
one or more sockets or lands coupling the one or more IC components to the edge connector traces; and
a semicircular indent or through hole at a second edge of the second PCB, the screw extending through the indent or hole, wherein the metal feature comprises an electrically conductive trace adjacent to an edge of the indent or through hole and electrically coupled to a ground plane of the second PCB; wherein the pad comprises an annular washer surrounding the screw that is compressed between the screw head and the electrically conductive trace.

11. The assembly of claim 10, wherein:
the one or more IC components comprise a plurality of non-volatile memory ICs; and
the edge connector and the screw mount are only physical connections between the first and second substrates.

12. The assembly of claim 1, wherein the first substrate is a metal heat sink and the second substrate is a printed circuit board (PCB).

13. An electronic computing device, comprising:
a mother board including a screw mount electrically coupled to a ground plane of the motherboard, and an edge connector socket;
a solid state drive (SSD) including a plurality of non-volatile memory ICs mounted to a printed circuit board (PCB), the PCB having:
edge connector traces at a first edge of the PCB mated with the edge connector socket, the traces coupled to the memory ICs;
a semicircular indent or through hole at a second edge of the PCB; and
an electrically conductive trace adjacent to an edge of the indent or through hole, and electrically coupled to a ground plane of the PCB;
a screw affixing the PCB to the motherboard, the screw passing through the indent or hole; and
an annular washer surrounding the screw and located between a head of the screw and the electrically conductive trace, wherein:
the ground planes of the PCB and motherboard are electrically coupled through at least the washer;
the PCB is thermally coupled to the motherboard through at least the washer; and the washer is elastically deformed between a head of the screw and the PCB;
wherein the washer comprises a material having a hardness below 50 Shore C;
wherein the washer comprises a material having a thermal conductivity of at least 1 W/m-K; and
wherein the washer comprises a material having a volume resistivity no more than $1.0 \times 10^4$ Ω-cm.

14. The device of claim 13, wherein the washer comprises a material loaded with a conductive filler.

15. The device of claim 14, wherein:
the loaded material comprises silicone;
the filler comprises at least one of carbon particles, metal particles, or metal-coated particles; and the loaded material has:
a hardness no more than 50 Shore A;
a thermal conductivity of at least 30 W/m-K; and
a volume resistivity no more than 500 Ω-cm.

16. The device of claim 13, further comprising:
a microprocessor electrically coupled to the motherboard; and
a chassis to which the motherboard is mounted.

* * * * *